(12) United States Patent
Tzu et al.

(10) Patent No.: US 7,187,064 B2
(45) Date of Patent: Mar. 6, 2007

(54) ELECTRICAL-INTERFERENCE-ISOLATED TRANSISTOR STRUCTURE

(75) Inventors: Chung-Hsing Tzu, Zhong-he (TW); Shih-yi Chang, Sindian (TW)

(73) Assignee: Domintech Co., Ltd., Taipei County (TW)

( * ) Notice: Subject to any disclaimer, the term of this patent is extended or adjusted under 35 U.S.C. 154(b) by 222 days.

(21) Appl. No.: 11/051,677

(22) Filed: Feb. 7, 2005

(65) Prior Publication Data

US 2006/0125063 A1  Jun. 15, 2006

(30) Foreign Application Priority Data

Dec. 9, 2004  (TW) .............................. 93219845 U

(51) Int. Cl.
*H01L 23/495* (2006.01)

(52) U.S. Cl. ...................... 257/666; 257/676
(58) Field of Classification Search ............... 257/666, 257/676, 665

See application file for complete search history.

(56) References Cited

U.S. PATENT DOCUMENTS

| 5,233,220 A | * | 8/1993 | Lamson et al. ............. 257/666 |
| 5,386,141 A | * | 1/1995 | Liang et al. ................ 257/676 |
| 7,061,085 B2 | * | 6/2006 | Moxham ..................... 257/684 |

* cited by examiner

*Primary Examiner*—Roy Karl Potter
(74) *Attorney, Agent, or Firm*—Birch, Stewart, Kolasch & Birch, LLP

(57) ABSTRACT

A transistor structure includes at least one chip; a packaging insulating layer, a first adhesive layer, a conducting layer, and a second adhesive layer sequentially provided on one side of the chip having electrical contacts thereon, so that the conducting layer is bonded between the first and the second adhesive layer; and a leadframe bonded to an outer side of the second adhesive layer. The conducting layer may be a metal sheet, a metal film, or a type of conducting fiber. The leadframe is connected to the electrical contacts on the chip via lead wires, and at least one of the electrical contacts on the chip is connected to the conducting layer via a conductor, so that the conducting layer is able to isolate electrical noises and reduce electromagnetic interferences, improve rates of transmission and heat release, strengthen chip packaging structure, and serve as a common grounding circuit.

12 Claims, 4 Drawing Sheets

ELECTRICAL-INTERFERENCE-ISOLATED TRANSISTOR STRUCTURE

FIELD OF THE INVENTION

The present invention relates to an electrical-interference-isolated transistor structure, and more particularly to a chip packaging structure that includes shielding and grounding structure to enable reduced electrical noise interference and improved rate of heat release thereof.

BACKGROUND OF THE INVENTION

FIG. 1 is a sectional view of a conventional chip packaging structure, in which a chip 10 is positioned on a chip pad 20 and a leadframe 30 is provided at each lateral side of the chip 10 to electrically connect with external elements. Each leadframe 30 includes a plurality of sequentially arranged terminal legs 301, which are connected to contacts on the chip 10 via gold wires 40. An insulating sealing material 50 is applied to enclose the chip 10 and thereby protects and locates the chip 10, the gold wires 40, and other internal elements in place.

It is known that electronic products in operation produce electromagnetic interferences (EMI), noises, including shot noise, flicker noise, surge noise, thermal noise, partition noise, etc., and high temperature. Most of the noises are produced due to electromagnetic interference and have adverse influences on the stability of the whole electronic system. It is difficult to completely overcome the electromagnetic interference, which must be, however, reduced to be lower than a standard value through proper circuit design or shielding and grounding structures for the electronic elements, so as to achieve the purpose of electromagnetic compatibility.

However, the above-described conventional chip packaging structure does not include any structural design for preventing electromagnetic interference to meet the high standard of electromagnetic compatibility required by current electronic products.

SUMMARY OF THE INVENTION

A primary object of the present invention is to provide an electrical-interference-isolated transistor structure that has an improved chip packaging structure to isolate electrical noises, reduce electromagnetic interferences, improve transmission rate, strengthen chip packaging structure, serve as a common grounding circuit, and achieve an improved rate of heat release.

To achieve the above and other objects, the transistor structure of the present invention includes at least one chip; a packaging insulating layer, a first adhesive layer, a conducting layer, and a second adhesive layer sequentially provided on one side of the chip having electrical contacts provided thereon, so that the conducting layer is bonded between the first and the second adhesive layer; and a leadframe bonded to an outer side of the second adhesive layer. The conducting layer may be a metal sheet, a metal film, or a type of conducting fiber. The leadframe is electrically connected to the electrical contacts on the chip via lead wires, and at least one of the electrical contacts on the chip is electrically connected to the conducting layer via a conductor, so that the conducting layer is able to isolate electrical noises, reduce the electromagnetic interferences, improve the transmission rate, strengthen the chip packaging structure, serve as a common grounding circuit, and improve the rate of heat release in the whole transistor structure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
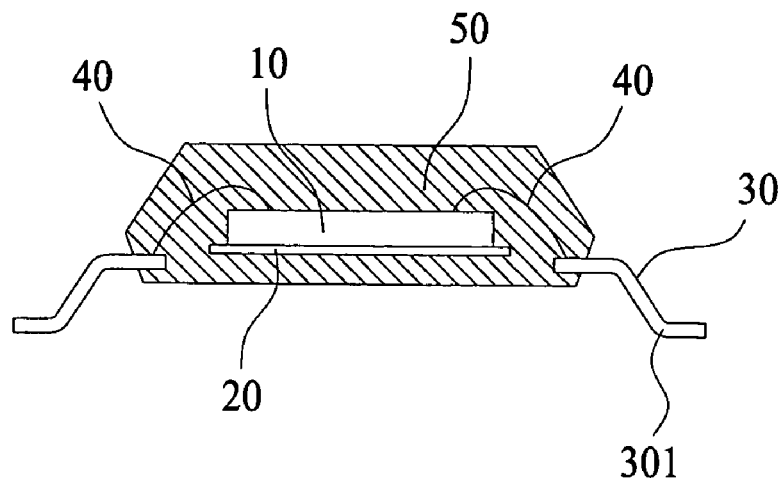
FIG. 1 is a sectional view of a conventional chip packaging structure.
Figure 2:
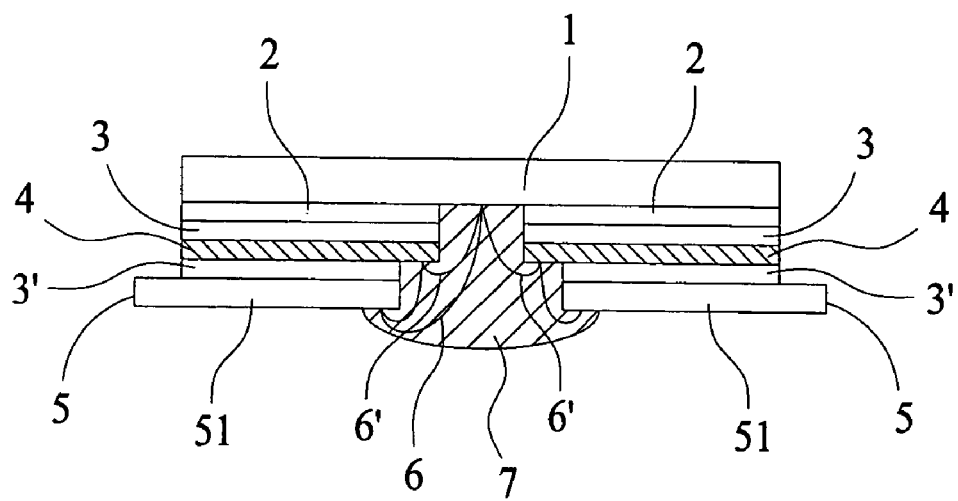
FIG. 2 is a sectional view of a chip packaging structure according to a preferred embodiment of the present invention.
Figure 3:
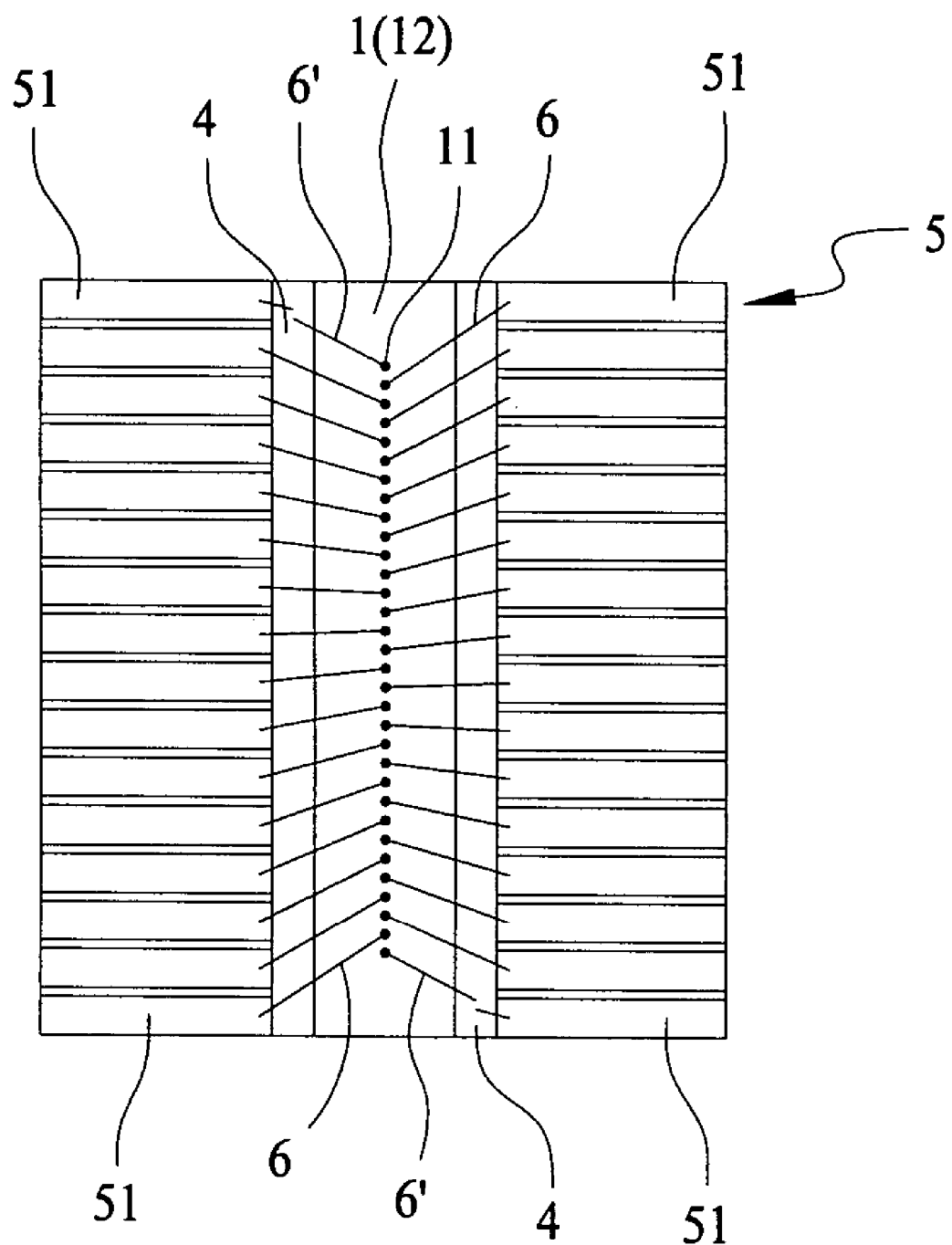
FIG. 3 is a bottom view of the chip packaging structure of FIG. 1.
Figure 4:
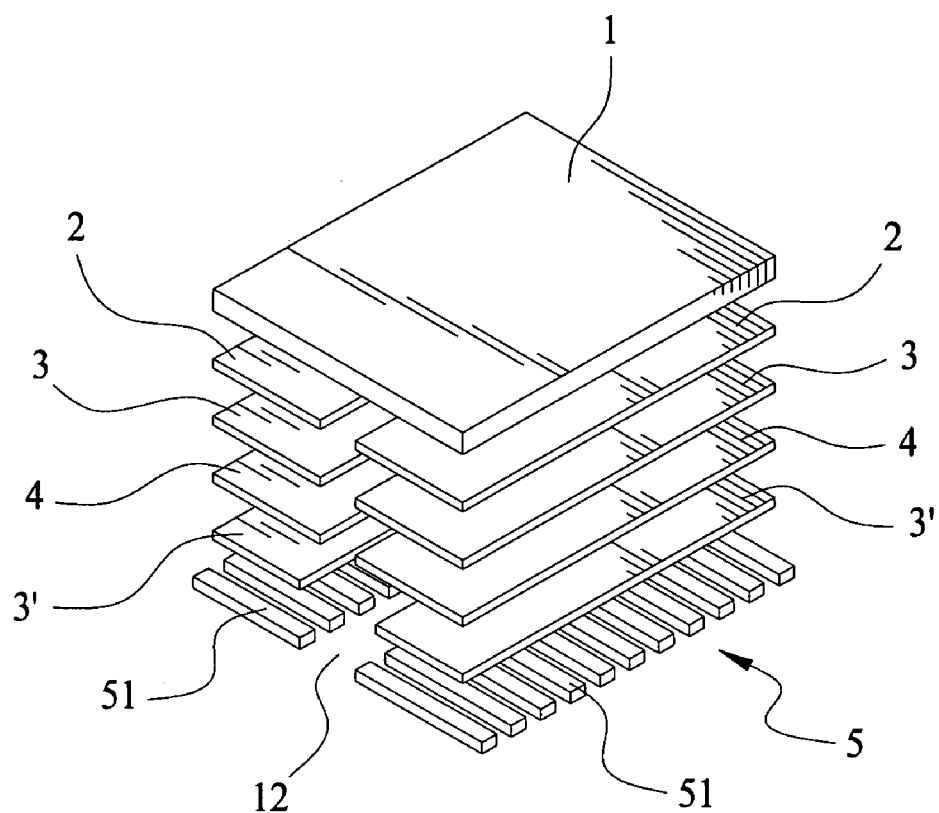
FIG. 4 is an exploded perspective view of the chip packaging structure of FIG. 1.

Please refer to FIGS. 2, 3, and 4 in which an electrical-interference-isolated transistor structure according to a preferred embodiment of the present invention is shown. As shown, the transistor structure of the present invention in this preferred embodiment mainly includes a chip 1, an optional packaging insulating layer 2, a first and a second adhesive layer 3, 3', a conducting layer 4, a leadframe 5, lead wires 6 and conductors 6' connecting the chip 1 to the conducting layer 4 and the leadframe 5, and a sealing material 7.

The chip 1, which is a known product and is therefore not discussed in any details herein, has one side provided with electrical contacts 11. The optional packaging insulating layer 2, the first adhesive layer 3, the conducting layer 4, and the second adhesive layer 3' are sequentially arranged on the chip 1 at the side with the electrical contacts 11 from inner to outer side, so that the conducting layer 4 is fixedly bonded between the first and the second adhesive layer 3, 3'. The leadframe 5 includes a plurality of terminal legs 51 and is bonded to an outer side of the second adhesive layer 3' to locate the conducting layer 4 between the chip 1 and the leadframe 5. Each electrical contact 11 on the chip 1 is electrically connected to a corresponding terminal leg 51 of the leadframe 5 via one lead wire 6, as shown in FIG. 3. Moreover, at least one of the electrical contacts 11 on the chip 1 is electrically connected to the conducting layer 4 and one selected terminal leg 51 of the leadframe 5 via at least one conductor 6'. The sealing material 7 is applied to a predetermined position on the chip 1 to provide a sealed structure and thereby complete the electrical-interference-isolated transistor structure of the present invention.

The optional packaging insulating layer 2 may be, for example, a type of packaging resin material, such as epoxy. The first and the second adhesive layer 3, 3' maybe, for example, a liquid substance, such as glue, that provides a bonding ability after becoming dried, or a tape. The conducting layer 4 may be, for example, a metal sheet, a metal film, or a type of electrically conducting fiber. Since the conducting layer 4 is electrically connected to the electrical contacts 11 on the chip 1 via the conductors 6', it may also serve as a ground or a power source. The leadframe 5 is made of a metal material by way of pressing, and includes a plurality of terminal legs 51 that are separated from one another for electrical connection to external elements. Each of the lead wires 6 is extended between one electrical contact 11 of the chip 1 and one corresponding terminal leg 51 of the leadframe 5 to electrically connect them to each other. The conductors 6' maybe otherwise in the form of connected leadwires. Therefore, with the conducting layer 4 that is arranged between the chip 1 and the leadframe 5 to form a shielding structure and electrically connected to at least one electrical contact 11 on the chip 1 via one conductor 6' to form a grounding structure, favorable effects of isolating electrical noises, reducing electromagnetic interferences (EMI), improving transmission rate, strengthening chip packaging structure, providing a common ground circuit, and improving rate of heat release may be achieved on the transistor structure of the present invention.

FIG. 3 is a bottom view of the preferred embodiment of the present invention shown in FIG. 2, in which the chip 1 is sequentially provided at each of two opposite edges of a selected side thereof, that is, the side with the electrical contacts 11, with the optional packaging insulating layer 2, the first adhesive layer 3, the conducting layer 4, the second adhesive layer 3', and the leadframe 5, such that a hollow space 12 is formed at a middle portion of the side of the chip 1 with the electrical contacts 11. The leadwires 6 connecting the electrical contacts 11 on the chip 1 with the terminal legs 51 of the leadframe 5 are located in the hollow space 12, and the sealing material 7 is applied into the hollow space 12 to seal the lead wires 6 in the hollow space 12 and thereby complete a packaged chip for use, for example, on a circuit board. With the shielding structure formed by the conducting layer 4 arranged between the chip 1 and the leadframe 5 and the grounding structure formed by electrically connecting the conducting layer 4 to at least one electrical contact 11 on the chip 1 and at least one terminal leg 51 of the leadframe via at least one conductor 6', the transistor structure of the present invention has the above-mentioned multiple effects.

Figure 6:
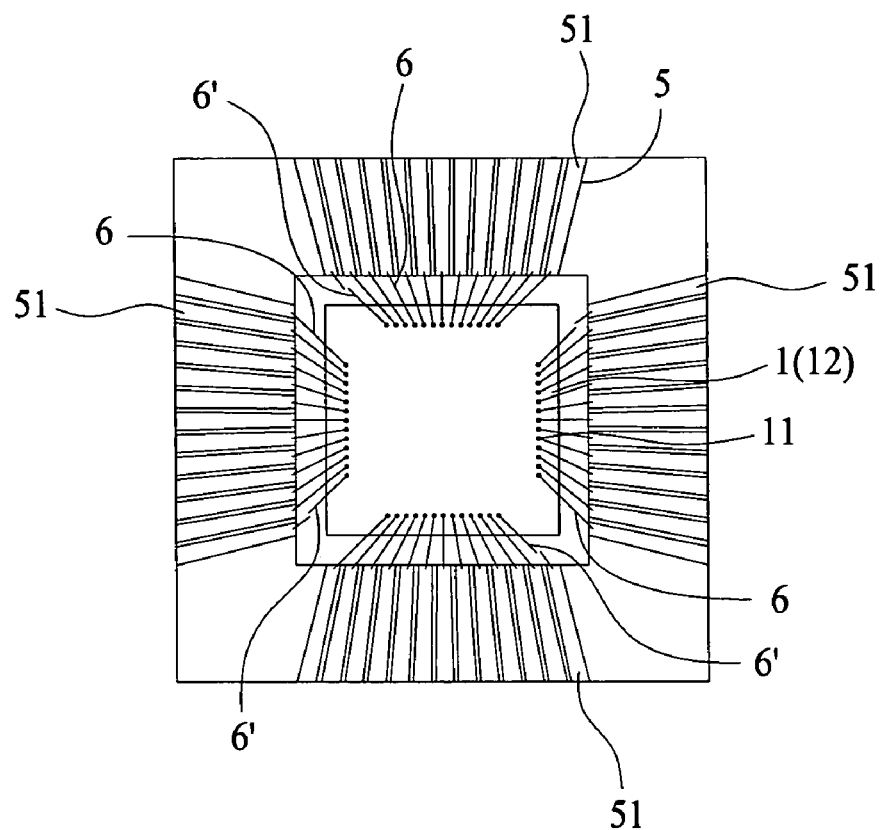
FIG. 6 is a bottom view of a chip packaging structure according to a further preferred embodiment of the present invention.

FIG. 6 is a bottom view of another preferred embodiment of the present invention structurally similar to that shown in FIG. 3, except that the optional packaging insulating layer 2, the first adhesive layer 3, the conducting layer 4, the second adhesive layer 3', and the leadframe 5 are sequentially provided at each of four edges of a selected side, that is, the side with the electrical contacts 11 of the chip 1 like a matrix, such that the hollow space 12 is formed at a central portion of the side of the chip 1 with the electrical contacts 11.

Figure 5:
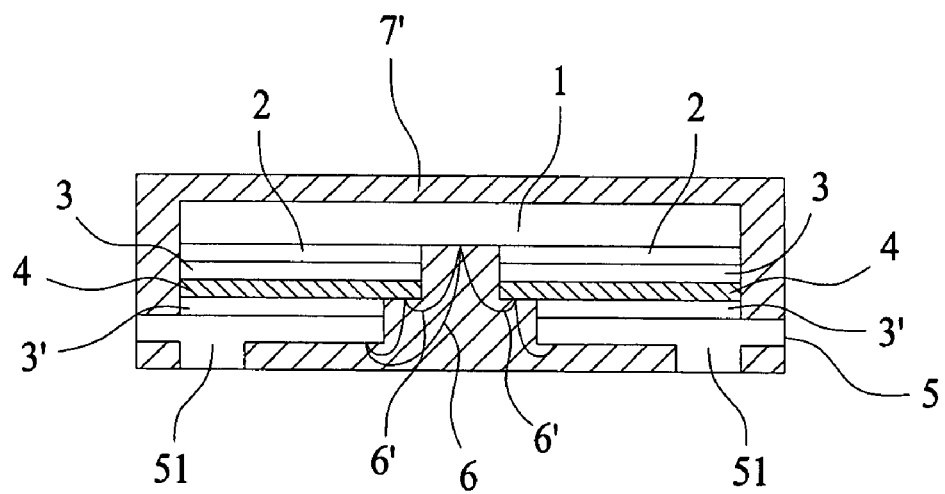
FIG. 5 is a sectional view of a chip packaging structure according to another preferred embodiment of the present invention.

FIG. 5 is a sectional view of a further preferred embodiment of the present invention similar to that of FIG. 2, except that a sealing material 7' is applied to all outer sides of the chip 1, the optional packaging insulating layer 2, the first adhesive layer 3, the conducting layer 4, the second adhesive layer 3', and the leadframe 5 to protect and maintain the chip 1 and all other internal components in a stable state. Again, the shielding structure formed by the conducting layer 4 arranged between the chip 1 and the leadframe 5 enables the present invention to have multiple improved effects.

Figure 7:
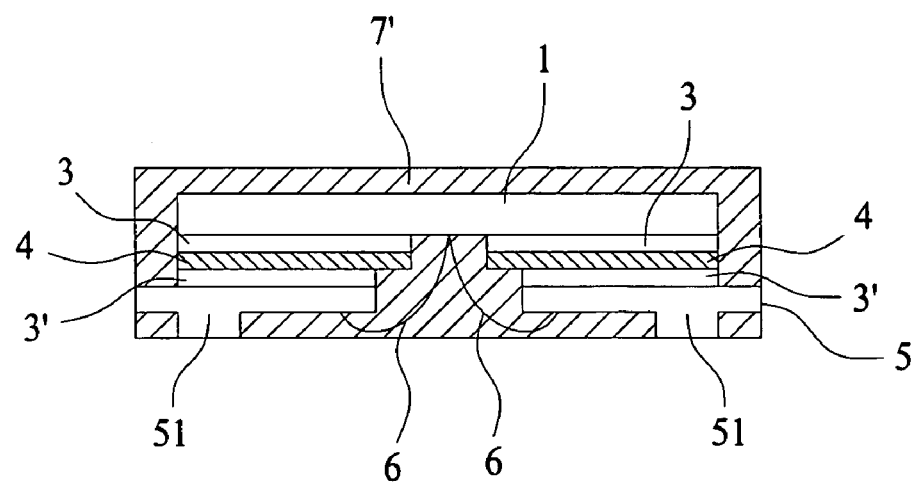
FIG. 7 is a sectional view of a chip packaging structure according to a still further preferred embodiment of the present invention.

What it to be noted is the present invention is characterized in that the chip 1 is sequentially provided at the selected side with the first adhesive layer 3, the conducting layer 4, the second adhesive layer 3', and the leadframe 5, so that the conducting layer 4 is utilized to achieve the isolation of electrical noises, the reduction of electromagnetic interferences (EMI), the improvement of transmission rate, the strengthening of chip packaging structure, the provision of a common ground circuit, and the improvement of rate of heat release for the present invention. As to the packaging insulating layer 2, it is an optional item and may be provided or omitted depending on different designs. As can be seen from FIG. 7, which is a sectional view of a still further preferred embodiment of the present invention similar to that shown in FIG. 5, the packaging insulating layer 2 is omitted from the chip packaging structure. Moreover, connection positions of the lead wires 6 and the conductors 6' and/or application patterns of the sealing material 7, 7' on the chip 1 described in the preferred embodiments may be changed and modified according to actual need without departing from the scope and the spirit of the invention that is intended to be limited only by the appended claims.

What is claimed is:

1. An electrical-interference-isolated transistor structure, comprising at least one chip having one side provided with a plurality of electrical contacts; a first adhesive layer, a conducting layer, and a second adhesive layer sequentially provided on said side of said at least one chip with said electrical contacts from inner to outer side with said conducting layer firmly bonded between said first and said second adhesive layer; and a leadframe bonded to an outer side of said second adhesive layer for said conducting layer to locate between said chip and said leadframe; said leadframe having a plurality of terminal legs, each of which is electrically connected to a corresponding one of said electrical contacts on said chip via a lead wire; and at least one of said electrical contacts on said chip being electrically connected to said conducting layer and a selected one of said terminal legs of said leadframe via a conductor.

2. The electrical-interference-isolated transistor structure as claimed in claim 1, wherein said first adhesive layer, said conducting layer, said second adhesive layer, and said leadframe are sequentially provided at two opposite edges of said side of said at least one chip with said electrical contacts, so that a hollow space is formed at a middle portion of said chip at said side with said electrical contacts; said lead wires and said conductors being located in said hollow space; and said hollow space being sealed by applying a sealing material thereinto.

3. The electrical-interference-isolated transistor structure as claimed in claim 1, wherein said first adhesive layer, said conducting layer, said second adhesive layer, and said leadframe are sequentially provided at four edges of said side of said at least one chip with said electrical contacts, so that a hollow space is formed at a central portion of said chip at said side with said electrical contacts; said lead wires and said conductors being located in said hollow space; and said hollow space being sealed by applying a sealing material thereinto.

4. The electrical-interference-isolated transistor structure as claimed in claim 1, wherein said conductors comprises lead wires.

5. The electrical-interference-isolated transistor structure as claimed in claim 2, wherein said conductors comprises lead wires.

6. The electrical-interference-isolated transistor structure as claimed in claim 3, wherein said conductors comprises lead wires.

7. The electrical-interference-isolated transistor structure as claimed in claim 1, wherein said first and said second adhesive layer comprise a liquid substance that has bonding ability after becoming dried; wherein said conducting layer is selected from the group consisting of a metal sheet, a metal film, and a type of electrically conducting fiber; and wherein said leadframe is made of a metal material by way of pressing, and said terminal legs of said leadframe being separated from one another for electrically connecting to external elements.

8. The electrical-interference-isolated transistor structure as claimed in claim 2, wherein said first and said second adhesive layer comprise a liquid substance that has bonding ability after becoming dried; wherein said conducting layer is selected from the group consisting of a metal sheet, a metal film, and a type of electrically conducting fiber; and wherein said leadframe is made of a metal material by way of pressing, and said terminal legs of said leadframe being separated from one another for electrically connecting to external elements.

9. The electrical-interference-isolated transistor structure as claimed in claim 3, wherein said first and said second adhesive layer comprise a liquid substance that has bonding ability after becoming dried; wherein said conducting layer is selected from the group consisting of a metal sheet, a metal film, and a type electrically conducting fiber; and wherein said leadframe is made of a metal material by way of pressing, and said terminal legs of said leadframe being separated from one another for electrically connecting to external elements.

10. The electrical-interference-isolated transistor structure as claimed in claim 1, further comprising a packaging insulating layer provided between said at least one chip and said first adhesive layer, and said packaging insulating layer being selected from the group consisting of a liquid substance that has bonding ability after becoming dried, a packaging resin, and other plastic materials.

11. The electrical-interference-isolated transistor structure as claimed in claim 2, further comprising a packaging insulating layer provided between said at least one chip and said first adhesive layer, and said packaging insulating layer being selected from the group consisting of a liquid substance that has bonding ability after becoming dried, a packaging resin, and other plastic materials.

12. The electrical-interference-isolated transistor structure as claimed in claim 3, further comprising a packaging insulating layer provided between said at least one chip and said first adhesive layer, and said packaging insulating layer being selected from the group consisting of a liquid substance that has bonding ability after becoming dried, a packaging resin, and other plastic materials.

* * * * *